(12) United States Patent
Azmat et al.

(10) Patent No.: US 10,224,331 B2
(45) Date of Patent: Mar. 5, 2019

(54) SEMICONDUCTOR DEVICE

(71) Applicant: SAMSUNG ELECTRONICS CO., LTD., Suwon-si, Gyeonggi-do (KR)

(72) Inventors: Raheel Azmat, Suwon-si (KR); Deepak Sharma, Suwon-si (KR); Su-Hyeon Kim, Bucheon-si (KR); Chulhong Park, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/911,922

(22) Filed: Mar. 5, 2018

(65) Prior Publication Data

US 2018/0197859 A1  Jul. 12, 2018

Related U.S. Application Data

(63) Continuation of application No. 15/174,036, filed on Jun. 6, 2016, now abandoned.

(30) Foreign Application Priority Data

Aug. 21, 2015  (KR) .................. 10-2015-0118190

(51) Int. Cl.
*H01L 27/092* (2006.01)
*H01L 29/06* (2006.01)
*H01L 27/02* (2006.01)
*H01L 27/118* (2006.01)
*H01L 29/775* (2006.01)

(52) U.S. Cl.
CPC ...... *H01L 27/0924* (2013.01); *H01L 27/0207* (2013.01); *H01L 27/092* (2013.01); *H01L 27/11807* (2013.01); *H01L 29/0649* (2013.01); *H01L 29/775* (2013.01); *H01L 2027/11859* (2013.01)

(58) Field of Classification Search
CPC ............. H01L 27/0924; H01L 29/0649; H01L 27/0207; H01L 29/775; H01L 23/528; H01L 27/088; H01L 23/5226; H01L 21/823821; H01L 27/092; H01L 21/823828
See application file for complete search history.

(56) References Cited

U.S. PATENT DOCUMENTS 7,302,660 B2  11/2007  Shimamura
7,679,106 B2  3/2010  Hamada
8,350,330 B2  1/2013  Lu et al.
(Continued)

*Primary Examiner* — Mouloucoulaye Inoussa
(74) *Attorney, Agent, or Firm* — F. Chau & Associates, LLC

(57) ABSTRACT

Provided is a semiconductor device including a substrate with first, second, and third logic cells, active patterns provided in each of the first to third logic cells to protrude from the substrate, and gate structures crossing the active patterns. The second and third logic cells are spaced apart from each other in a first direction with the first logic cell interposed therebetween. The active patterns are arranged in the first direction and extend in a second direction crossing the first direction. When measured in the first direction, a distance between the closest adjacent pair of the active patterns with each in the first and second logic cells respectively is different from that between the closest pair of the active patterns with each in the first and third logic cells respectively.

19 Claims, 11 Drawing Sheets

(56) References Cited

U.S. PATENT DOCUMENTS

| | | |
|---|---|---|
| 8,368,225 B2 | 2/2013 | Ikegami et al. |
| 8,436,405 B2 | 5/2013 | Liaw |
| 8,759,885 B1 | 6/2014 | Jain et al. |
| 8,847,284 B2 | 9/2014 | Yang et al. |
| 8,869,090 B2 | 10/2014 | Ke et al. |
| 8,924,908 B2 | 12/2014 | Kawa et al. |
| 8,937,358 B2 | 1/2015 | Yang et al. |
| 8,987,828 B2 | 3/2015 | Moroz et al. |
| 9,053,283 B2 | 6/2015 | Chen et al. |
| 9,147,652 B2 | 9/2015 | Okamoto et al. |
| 2014/0252476 A1 | 9/2014 | Chang et al. |
| 2015/0179646 A1* | 6/2015 | Azmat ............... H01L 27/092 257/369 |
| 2016/0086947 A1 | 3/2016 | Park et al. |
| 2017/0053917 A1 | 2/2017 | Azmat et al. |

\* cited by examiner

SEMICONDUCTOR DEVICE

CROSS-REFERENCE TO RELATED APPLICATION

This application is a continuation of U.S. application Ser. No. 15/174,036 filed on Jun. 6, 2016, which claims the benefit under 35 U.S.C. § 119 of Korean Patent Application No. 10-2015-0118190, filed on Aug. 21, 2015, in the Korean Intellectual Property Office, the entire contents of which are incorporated by reference herein.

TECHNICAL FIELD

The present invention relates generally to a semiconductor device, and in particular, to a semiconductor device including a plurality of logic cells.

DISCUSSION OF RELATED ART

Due to their characteristics of being small, multifunctional, and/or low-cost, semiconductor devices are advantageous over other type of electronic devices and are commonly used in the electronic industry. The semiconductor devices may be classified into a memory device for storing data, a logic device for processing data, and a hybrid device including both memory and logic elements. To meet the increased demand for electronic devices with fast speed and/or low power consumption, the semiconductor devices require high reliability, high performance, and/or multiple functions. To satisfy these requirements, complexity and/or integration density of the semiconductor devices are being increased.

SUMMARY

Example embodiments of the inventive concept provide a highly-integrated semiconductor device, in which a field effect transistor with improved electric characteristics is included.

According to an example embodiment of the inventive concept, a semiconductor device may include a substrate including first, second, and third logic cells, the second and third logic cells being spaced apart from each other in a first direction with the first logic cell interposed therebetween, active patterns provided in each of the first to third logic cells to protrude from the substrate, and gate structures crossing the active patterns. The active patterns may be arranged in the first direction and may extend in a second direction crossing the first direction. A first distance between a first adjacent pair of the active patterns of the first and second logic cells may be different from a second distance between a second adjacent pair of the active patterns of the first and third logic cells. The active patterns of the first adjacent pair contain one active pattern in the first logic cell and the other active pattern in the second logic cell. The active patterns of the first adjacent pair are most adjacent to each other in the first direction in comparison to the active patterns of any other pairs containing one active pattern in the first logic cell and the other active pattern in the second logic cell. The active patterns of the second adjacent pair contain one active pattern in the first logic cell and the other active pattern in the third logic cell. The active patterns of the second adjacent pair are most adjacent to each other in the first direction in comparison to the active patterns of any other pairs containing one active pattern in the first logic cell and the other active pattern in the third logic cell.

In an example embodiment of the inventive concept, each of the first to third logic cells may include first and second active regions having conductivity types different from each other, and the active patterns may constitute the first and second active regions of each of the first to third logic cells. The active patterns in the first active region may be provided to have a first pitch, and the active patterns in the second active region may be provided to have a second pitch that is substantially the same as the first pitch. A difference between the first and second distances may be substantially the same as the first pitch.

In an example embodiment of the inventive concept, the semiconductor device may further include a first device isolation layer provided in each of the first to third logic cells. The first device isolation layer may be provided between the first and second active regions of each of the first to third logic cells and in the substrate to extend in the second direction.

In an example embodiment of the inventive concept, a first width of the first device isolation layer measured in the first direction may be larger than the first pitch.

In an example embodiment of the inventive concept, the first and second logic cells may share a first cell boundary that is positioned between the first and second logic cells to extend in the second direction, and the first and third logic cells may share a second cell boundary that is positioned between the first and third logic cells to extend in the second direction. The first logic cell may have an internal boundary that is equidistant from adjacent ones of the active patterns spaced apart from each other with the first device isolation layer interposed therebetween. When viewed in a plan view, a first height from the internal boundary to the first cell boundary may be different from a second height from the second cell boundary to the internal boundary.

In an example embodiment of the inventive concept, the first cell boundary may be equidistant from the first adjacent pair of the active patterns defining the first distance, and the second cell boundary may be equidistant from the second adjacent pair of the active patterns defining the second distance.

In an example embodiment of the inventive concept, a difference between the first and second heights may be half the first pitch.

In an example embodiment of the inventive concept, the semiconductor device may further include an upper second device isolation layer provided in the substrate and between adjacent ones of the active patterns which include one from the first logic cell and the other one from the second logic cell, and a lower second device isolation layer provided in the substrate and between adjacent ones of the active patterns which include one from the first logic cell and the other one from the third logic cell. The upper and lower second device isolation layers may extend in the second direction, and when measured in the first direction, a second width of the upper second device isolation layer may be different from a third width of the lower second device isolation layer.

In an example embodiment of the inventive concept, the first cell boundary may be defined as a center line of the upper second device isolation layer, and the second cell boundary may be defined as a center line of the lower second device isolation layer.

In an example embodiment of the inventive concept, each of the active regions of the first and second logic cells adjacent to each other may be the first active region, and each of the active regions of the first and third logic cells adjacent to each other may be the second active region.

In an example embodiment of the inventive concept, when the first height is greater than the second height, the first distance may be greater than the second distance and the second width may be greater than the third width. When the second height is greater than the first height, the first distance may be smaller than the second distance and the second width may be smaller than the third width.

In an example embodiment of the inventive concept, the semiconductor device may further include source/drain regions provided on the active patterns and at both sides of the gate structures, source/drain contacts connected to at least one of the source/drain regions, a first common conductive line extending along the first cell boundary and in the second direction, the first common conductive line being overlapped with the upper second device isolation layer, and a second common conductive line extending along the second cell boundary and in the second direction, the second common conductive line being overlapped with the lower second device isolation layer. At least one of the source/drain contacts may be connected to the first common conductive line, and at least one other of the source/drain contacts may be connected to the second common conductive line.

In an example embodiment of the inventive concept, when measured in the first direction, the first common conductive line has a fourth width and the second common conductive line has a fifth width. The fourth width may be different from the fifth width.

In an example embodiment of the inventive concept, when the first height is greater than the second height, the fourth width may be greater than the fifth width. When the second height is greater than the first height, the fourth width may be smaller than the fifth width.

In an example embodiment of the inventive concept, the semiconductor device may further include a third device isolation layer, which is provided on the substrate and at both sides of the active patterns and is formed to expose upper portions of the active patterns. The third device isolation layer may be thinner than the first device isolation layer.

According to an example embodiment of the inventive concept, a semiconductor device may include a substrate including a plurality of logic cells arranged in a first direction, each of the plurality of logic cells including first and second regions that are spaced apart from each other in the first direction, active patterns provided in each of the first and second regions and arranged in the first direction, the active patterns protruding from the substrate and extending in a second direction crossing the first direction, and gate structures arranged in the second direction to extend in the first direction and cross at least one of the active patterns. A conductivity type of the active patterns of the first region may be different from that of the active patterns of the second region. Each of the plurality of logic cells may include first and second cell boundaries, each of which is shared by adjacent ones of the logic cells facing each other in the first direction, and an internal boundary interposed between the first and second regions and being equidistant from an adjacent pair of the active patterns, which include one in the first region and the other one in the second region, that are most adjacent to each other in the first direction. When viewed in a plan view, a first height from the internal boundary to the first cell boundary may be greater than a second height from the second cell boundary to the internal boundary.

In an example embodiment of the inventive concept, a pitch of the active patterns of the first region may be substantially the same as that of the active patterns of the second region, and the first height may be greater by half the pitch than the second height.

In an example embodiment of the inventive concept, when viewed in a plan view, each of the plurality of logic cells may have a cell height that is defined as a distance between the first and second cell boundaries, and here, the cell heights of the plurality of logic cells may be substantially the same.

In an example embodiment of the inventive concept, the first cell boundary may be defined as a center line between the active patterns that are most adjacent to each other with the first cell boundary interposed therebetween, and the second cell boundary may be defined as a center line between the active patterns that are most adjacent to each other with the second cell boundary interposed therebetween.

In an example embodiment of the inventive concept, a distance between the active patterns defining the first cell boundary may be greater by the pitch than a distance between the active patterns defining the second cell boundary.

In an example embodiment of the inventive concept, each of the active patterns defining the first cell boundary may be provided in the first region of its corresponding logic cell, and each of the active patterns defining the second cell boundary may be provided in the second region of its corresponding logic cell.

In an example embodiment of the inventive concept, the semiconductor device may further include a first device isolation layer provided in each of the logic cells and in the substrate between the first and second regions. The first device isolation layer may extend in the second direction and may be overlapped with the internal boundary.

In an example embodiment of the inventive concept, a first width of the first device isolation layer measured in the first direction may be larger than the pitch.

In an example embodiment of the inventive concept, the semiconductor device may further include an upper second device isolation layer provided in the substrate and between an adjacent pair of the active patterns with each active pattern from each of the first regions of the logic cells sharing the first cell boundary, and a lower second device isolation layer provided in the substrate and between an adjacent pair of the active patterns with each active pattern from each of the second regions of the logic cells sharing the second cell boundary. A second width of the upper second device isolation layer measured in the first direction may be greater than a third width of the lower second device isolation layer measured in the first direction.

In an example embodiment of the inventive concept, the semiconductor device may further include source/drain regions provided on the active patterns and at both sides of the gate structures, source/drain contacts connected to at least one of the source/drain regions, a first common conductive line extending along the first cell boundary and in the second direction, and a second common conductive line extending along the second cell boundary and in the second direction. At least one of the source/drain contacts may be connected to the first common conductive line, and at least one other of the source/drain contacts may be connected to the second common conductive line.

In an example embodiment of the inventive concept, when measured in the first direction, a fourth width of the first common conductive line may be greater than a fifth width of the second common conductive line.

BRIEF DESCRIPTION OF THE DRAWINGS

Example embodiments of the inventive concept will be more clearly understood from the following detailed description of the embodiments taken in conjunction with the appended drawings, and in which:

FIGS. 8A through 10A are cross-sectional views, which are taken along line I-I' of FIG. 5 to illustrate a method of fabricating a semiconductor device according to an example embodiment of the inventive concept;

FIGS. 8B through 10B are cross-sectional views taken along line II-II' of FIG. 5 according to an example embodiment of the inventive concept;

Figure 1:
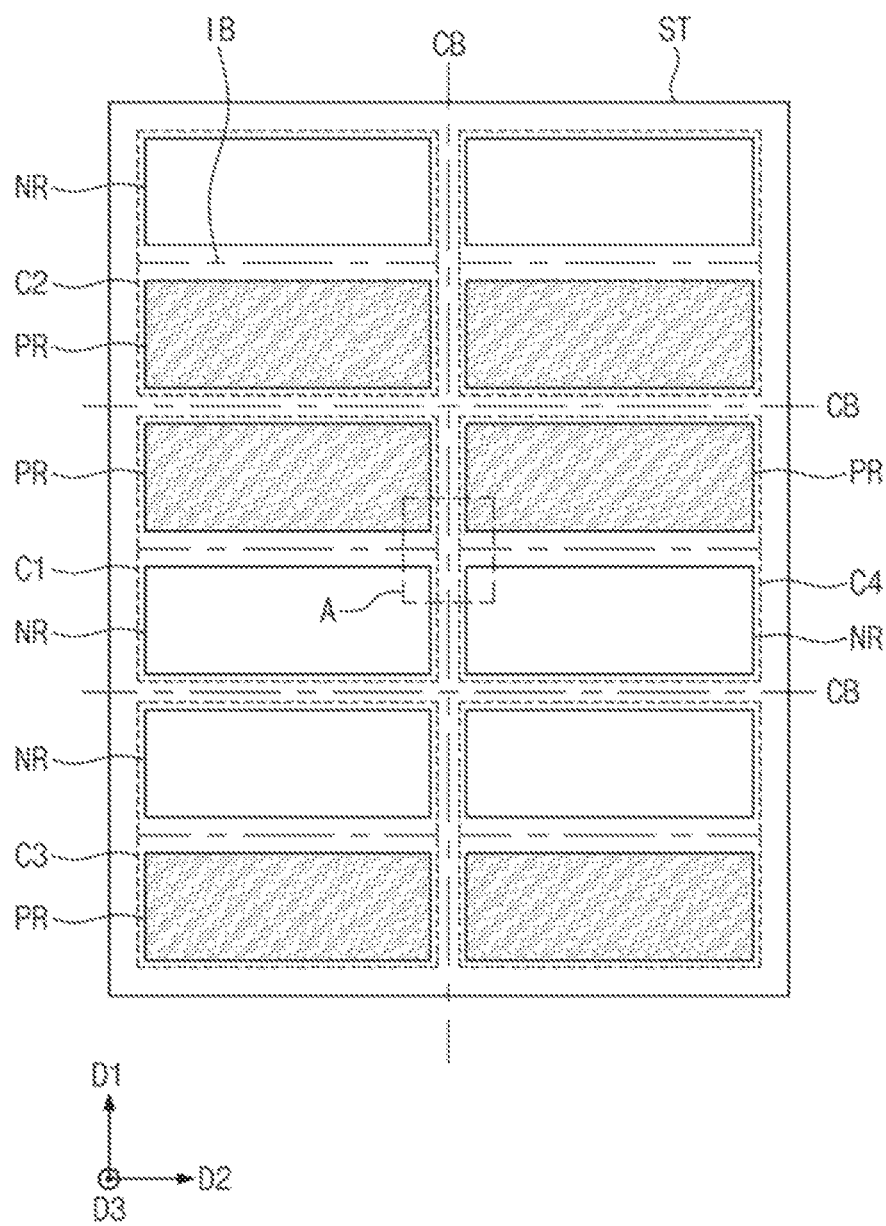
FIG. 1 is a plan view of a semiconductor device according to an example embodiment of the inventive concept.

It should be noted that FIGS. 1-12 are intended to illustrate the general characteristics of methods, structures and/or materials utilized in certain example embodiments of the inventive concept and to supplement the written description provided below. These drawings are not necessarily drawn to scale and may not precisely reflect the structural or performance characteristics of any given example embodiment, and should not be interpreted as defining or limiting the range of values or properties encompassed by the example embodiments of the inventive concept. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. Like reference numerals in the drawings denote like elements throughout the specification.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between", "adjacent" versus "directly adjacent", "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, or vice versa, without departing from the teachings of example embodiments of the inventive concept.

Spatially relative terms, such as "beneath", "below", "lower", "above", "upper" and the like, may be used herein to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be oriented differently (for example, rotated 90 degrees or at other orientations) and the spatially relative descriptors used herein would then be interpreted accordingly.

The terminology used herein is for the purpose of describing particular example embodiments and is not intended to be limiting of the present inventive concept. As used herein, the singular forms "a", "an" and "the" are intended to include the plural forms as well, unless the context clearly indicates otherwise. It will be further understood that the terms "comprises", "comprising", "includes" and/or "including", if used herein, specify the presence of stated features, integers, steps, operations, elements, components and/or groups, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a semiconductor device according to an example embodiment of the inventive concept.

Referring to FIG. 1, a semiconductor device may include a plurality of logic cells integrated on a substrate. As an example, the logic cells may include a first logic cell C1, a second and a third logic cells C2 and C3, which are spaced apart from each other in a first direction D1 with the first logic cell C1 interposed therebetween, and a fourth logic cell C4, which is spaced apart from the first logic cell C1 in a second direction D2 crossing the first direction D1. A cell boundary CB may be defined between adjacent logic cells. For example, the adjacent logic cells may be configured to share the cell boundary CB therebetween. Although six logic cells are illustrated in FIG. 1, the inventive concept is not limited thereto.

Each of the logic cells may include active regions separated apart from each other by a device isolation layer ST. For example, each of the logic cells may include a PMOSFET region PR and an NMOSFET region NR, which are separated from each other by the device isolation layer ST and have different conductivity types. The PMOSFET region PR and the NMOSFET region NR may be spaced apart from each other in the first direction D1. In addition, logic cells adjacent to each other in the first direction D1 may be arranged in such a way that the active regions of the same conductivity type face each other. For example, the PMOSFET regions PR of the first and second logic cells C1 and C2 may be adjacent to each other in the first direction D1, and the NMOSFET regions NR of the first and second logic cells C1 and C3 may be adjacent to each other in the first direction D1. Each of the logic cells may include at least one PMOS transistor integrated in the PMOSFET region PR and at least one NMOS transistor integrated in the NMOSFET region NR. In each of the logic cells, the transistors may constitute at least a part of a logic circuit for performing a Boolean logic function (e.g., INVERTER, AND, OR, NAND, NOR, and so forth) or a storage function (e.g., FLIP-FLOP). In the present specification, a term "logic cell" may refer to a unit circuit configured to perform a single logical operation or to a unit region provided with a logic circuit for performing the single logic operation.

According to an example embodiment of the inventive concept, the logic circuits may be designed, based on a standard cell scheme. As the demand for the highly-integrated semiconductor devices increases rapidly, a lot of time and money are being put into designing a layout for a semiconductor device, especially for a logic cell. A standard cell based design method may be used to design the layout for the logic cell. According to the standard cell based design method, some frequently used devices (e.g., OR gates or AND gates) may be designed as standard cells and then stored in a computer system, and the stored design of the standard cells may then be used to produce a desired semiconductor device. Thus, the process time for a layout design can be reduced by using the standard cell based design method.

In an example embodiment of the inventive concept, the transistors of each logic cell may be constructed, based on a FinFET technology. For example, at least one FinFET structure may be provided in the active regions PR and NR. Each of the active regions PR and NR may include a plurality of active patterns, which extend in a direction (e.g., the second direction D2) and are arranged in another direction (e.g., the first direction D1). Each or at least one of the active patterns may be a fin-shaped structure upwardly protruding from top surface of the substrate (for example, in a third direction D3 that is orthogonal to both of the first and second directions D1 and D2). Gate electrodes of the transistors may be disposed to extend in the first direction D1 and to cross at least one of the active patterns. A plurality of active patterns may be disposed in each of the active regions PR and NR, and the number of the active patterns may be changed according to the technical requirements of a desired semiconductor device. In an example embodiment of the inventive concept, the active regions PR and NR may be configured in such a way that there is no difference in the number of the active patterns. The active regions PR and NR may also be configured in such a way that there is no difference in terms of the pitch of the active patterns. For example, the pitch of the active patterns provided in the PMOSFET region PR may be substantially the same as the pitch of the active patterns provided in the NMOSFET region NR.

In each logic cell, a term "cell height" may be used to refer to a distance between the cell boundaries CB that are positioned adjacent and opposite to each other in the first direction D1. A term "cell width" may be used to refer to a distance between the cell boundaries CB that are positioned adjacent and opposite to each other in the second direction D2. Since the logic cell is constructed based on the FinFET technology, the cell height of the logic cell may be presented as a function of the number and pitch of the active patterns, which are provided in each of the active regions PR and NR. Also, in the case where a logic circuit of each logic cell is designed and disposed based on the standard cell based design method, the logic cells may be configured to have the same cell height. Alternatively, the cell width of each logic cell may be variously changed, if necessary. For example, at least two of the logic cells may be configured to have different cell width.

Each logic cell may be sectioned into two blocks by an internal boundary IB. These two blocks may correspond to two well regions having different conductivity types. According to an example embodiment of the inventive concept, these two blocks may have different planar sizes. For example, these two blocks may be configured to have the same width (e.g., in the second direction D2) but different lengths (e.g., in the first direction D1). Hereinafter, a block structure of the logic cell according to an example embodiment of the inventive concept will be described in more detail with reference to FIGS. 2 to 4.

Figure 2:
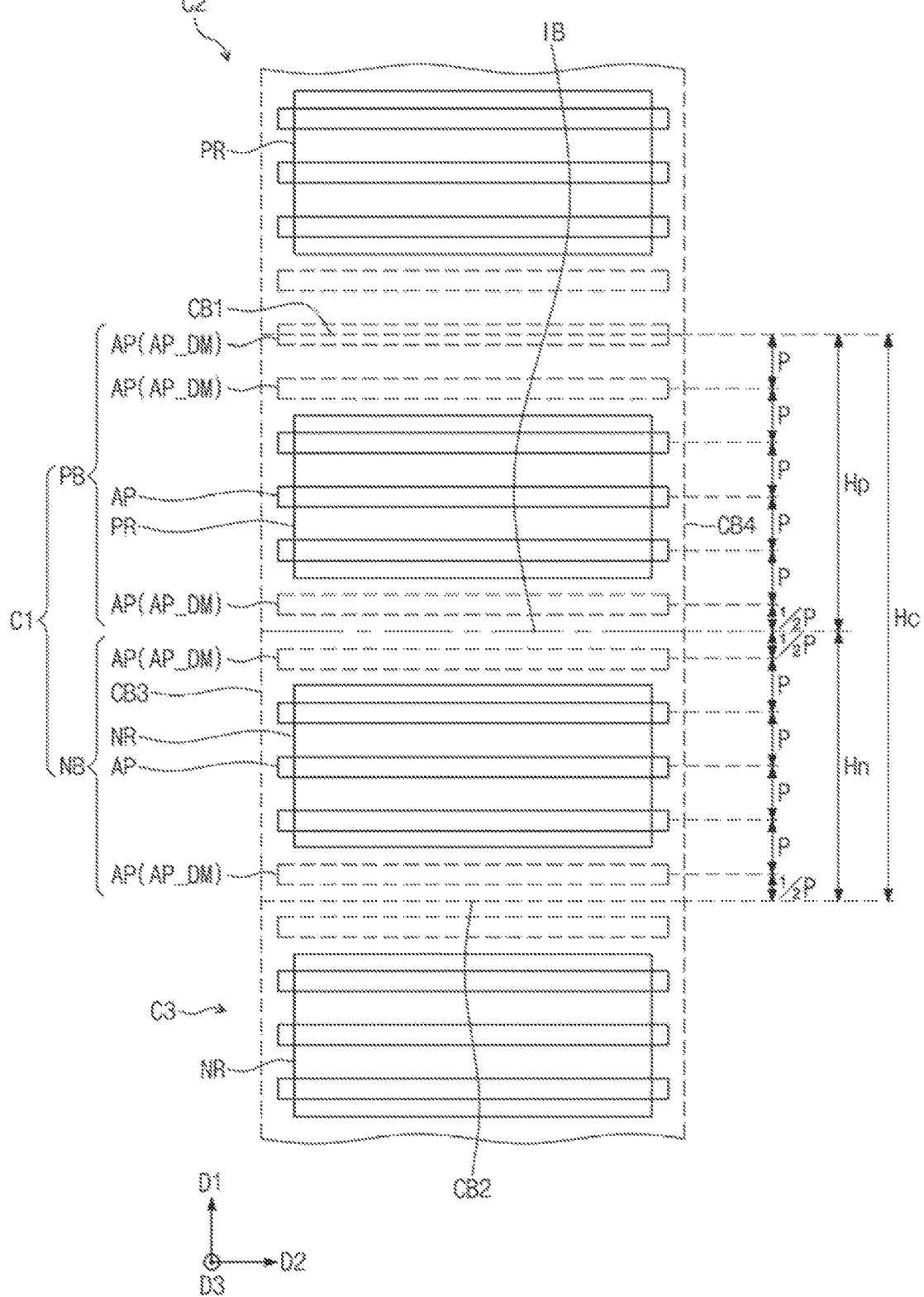
FIG. 2 is a plan view illustrating a region of the semiconductor device of FIG. 1, in which logic cells are disposed to have an asymmetric block structure according to an example embodiment of the inventive concept.
Figure 3:
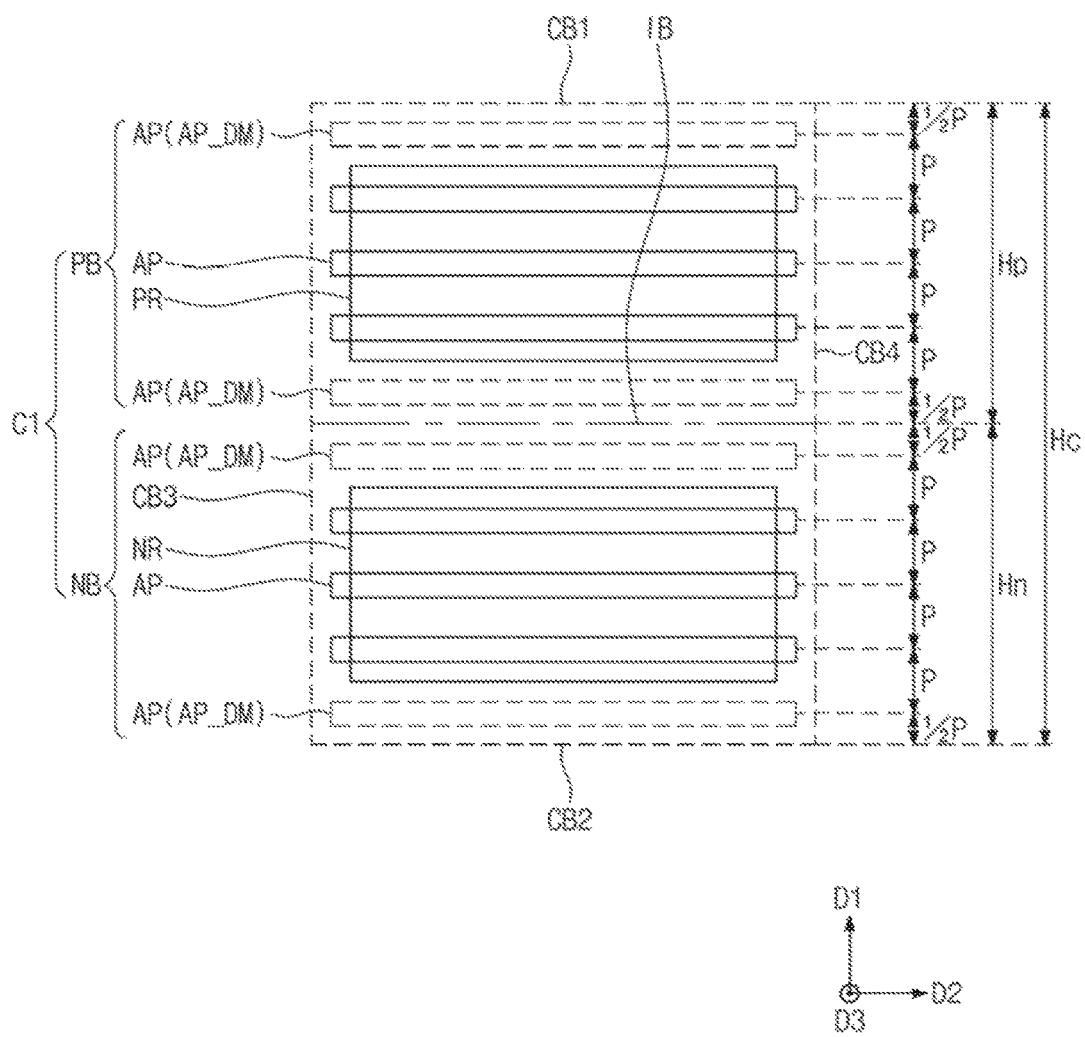
FIGS. 3 and 4 are plan views illustrating a region of a conventional semiconductor device, in which logic cells are disposed to have a symmetric block structure according to an example embodiment of the inventive concept.
Figure 4:
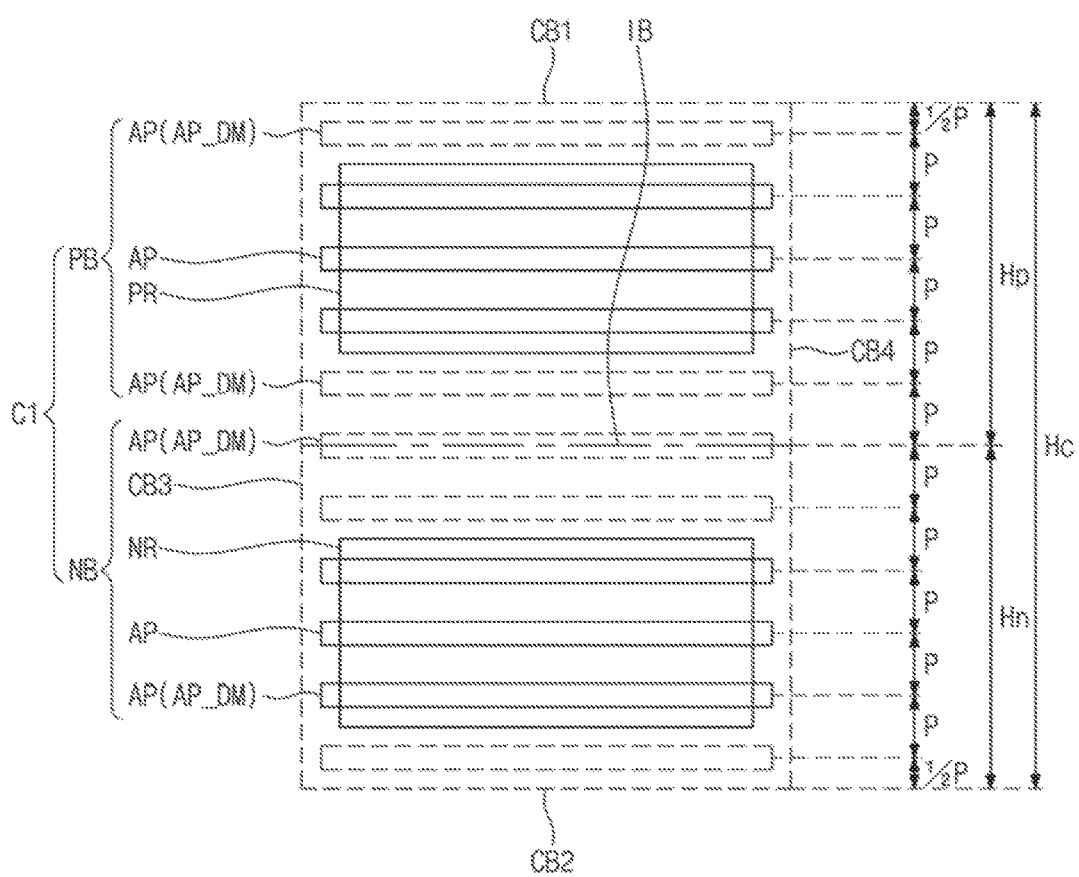

FIG. 2 is a plan view illustrating a region of the semiconductor device of FIG. 1, in which logic cells are disposed to have an asymmetric block structure according to an example embodiment of the inventive concept. FIGS. 3 and 4 are plan views illustrating a region of a conventional semiconductor device, in which logic cells are disposed to have a symmetric block structure. In order to reduce complexity in the drawings and to provide better understanding of the inventive concept, some elements (e.g., the active patterns) of the semiconductor device are selectively illustrated.

Referring to FIG. 2, the first logic cell C1 may include a p-block PB and an n-block NB arranged in the first direction D1. For example, the first logic cell C1 may include the p-block PB and the n-block NB, which are spaced apart from each other with the internal boundary IB interposed therebetween. The p-block PB may correspond to a region for an n-type well, whereas the n-block NB may correspond to another region for a p-type well. The internal boundary IB may correspond to a boundary region between the n- and p-wells. The internal boundary IB may extend in the second direction D2.

The first logic cell C1 may include a plurality of active patterns AP arranged in the first direction D1. The active patterns AP may be a line-shaped structure extending in the second direction D2 and may be disposed with a uniform pitch P in the first direction D1. For example, the active patterns AP may have substantially the same width and may be spaced apart from each other by substantially the same distance. Hereinafter, the pitch P of the active pattern AP will be referred to as a "fin pitch P". The fin pitch P may be defined as a distance between the center lines of an adjacent pair of the active patterns AP. In the present specification, a term "center line" means a line extending through a center of an object in an extension direction of the object or a line that is equidistant from the objects under consideration.

Some of the active patterns AP of the first logic cell C1 may constitute the PMOSFET region PR, and others may constitute the NMOSFET region NR. In each of the blocks PB and NB, the active patterns AP positioned outside the active regions PR and NR may serve as dummy active patterns AP_DM. In an example embodiment of the inventive concept, the dummy active patterns AP_DM may be removed from the final structure of the semiconductor device. The numbers of the active patterns AP of the active regions PR and NR may be substantially the same. Although each of the active regions PR and NR is illustrated to have three active patterns AP, the inventive concept may not be limited thereto. Also, as shown in FIG. 2, a pair of the dummy active patterns AP_DM may be provided between the active regions PR and NR, and at least one dummy active pattern AP_DM may be disposed at each side of each of the active regions PR and NR, that is at least two dummy active patterns AP_DM in each active region, but the inventive concept may not be limited thereto.

The first logic cell C1 may include first to fourth cell boundaries CB1-CB4. The first and second cell boundaries CB1 and CB2 may extend in parallel in the second direction D2 and face each other in the first direction D1. The third and fourth cell boundaries CB3 and CB4 may extend in parallel in the first direction D1 and face each other in the second direction D2. For example, the third and fourth cell boundaries CB3 and CB4 may be perpendicular to the first and second cell boundaries CB1 and CB2. Boundaries of each of the blocks PB and NB may be defined by the internal boundary IB and the first to fourth cell boundaries CB1-CB4. Although each of the blocks PB and NB of the first logic cell C1 is illustrated to have a single active region, the inventive concept may not be limited thereto. For example, a plurality of the active regions PR and NR may be provided in each of the blocks PB and NB. For example, the p-block PB may be configured to include a plurality of PMOSFET regions PR which are spaced apart from each other by a device isolation layer and are arranged in the second direction D2, and the n-block NB may be configured to include a plurality of NMOSFET regions NR which are spaced apart from each other by the device isolation layer and are arranged in the second direction D2.

In an example embodiment of the inventive concept, the first logic cell C1 may have an asymmetric block structure. For example, the blocks PB and NB of the first logic cell C1 may be different from each other in terms of their planar sizes or areas. As an example, the blocks PB and NB may be configured to have the same width (e.g., in the second direction D2) but different lengths (e.g., in the first direction D1). Here, the width of each of the blocks PB and NB may be defined as a distance between the third and fourth cell boundaries CB3 and CB4. Also, the length in the first direction D1 of the p-block PB may be defined as a distance between the internal boundary IB and the first cell boundary CB1, and the length in the first direction D1 of the n-block NB may be defined as a distance between the internal boundary IB and the second cell boundary CB2. Hereinafter, the length in the first direction D1 of the p-block PB may be referred to as a "p-block height Hp", and the length in the first direction D1 of the n-block NB may be referred to as an "n-block height Hn".

In an example embodiment of the inventive concept, between the first cell boundary CB1 and the PMOSFET region PR, the number of the dummy active patterns AP_DM may be 1.5, as shown in FIG. 2. For example, the first cell boundary CB1 may be aligned to or positioned on the center line of the dummy active pattern AP_DM shared by the first and second logic cells C1 and C2. Accordingly, the first cell boundary CB1 may be spaced apart from the center line of the most adjacent active pattern AP of the PMOSFET region PR by a distance of 2P. The first separation distance of the centerlines of the most adjacent pair of the active patterns AP, which include one from the PMOSFET PR in the first logic cell C1 and the other one from the PMOSFET PR in the second logic cell C2, is 4P. By contrast, between the second cell boundary CB2 and the NMOSFET region NR, the number of the dummy active patterns AP_DM may be one. The second cell boundary CB2 may be aligned to or positioned on the center line between an adjacent pair of the dummy active patterns AP_DM, which are respectively included in the first and third logic cells C1 and C3. Accordingly, the second cell boundary CB2 may be spaced apart from the center line of the active pattern AP of the NMOSFET region NR adjacent thereto by a distance of 1.5P. The second separation distance of the centerlines of the most adjacent pair of the active patterns AP, which include one from the NMOSFET NR in the first logic cell C1 and the other one from the NMOSFET NR in the third logic cell C3, is 3P. The internal boundary IB may be aligned to or positioned on the center line equidistant from an adjacent pair of the active patterns AP, which are respectively included in the PMOSFET and NMOSFET regions PR and NR. The active patterns AP of the adjacent pair described above are most adjacent to each other in comparison to the active patterns AP of any other pairs containing one active pattern AP in the PMOSFET region PR and the other active pattern AP in the NMOSFET region NR. Also, the internal boundary IB may be equidistant from an adjacent pair of the dummy active patterns AP_DM, which are respectively included in the p-block and n-blocks PB and NB. For example, the internal boundary IB may be spaced apart from the center line of the dummy active pattern AP_DM of the p-block PB and from the center line of the dummy active pattern AP_DM of the n-block NB by a distance of 0.5P. To sum up, the p-block height Hp may be 5.5 times the fin pitch P, and the n-block height Hn may be 5 times the fin pitch P. In other words, the p-block height Hp may be longer by 0.5 P than the n-block height Hn. A cell height Hc of the first logic cell C1 may be defined as a sum of the heights of the blocks PB and NB (i.e., Hp+Hn) and may be 10.5 times the fin pitch P (i.e., 10.5P). For example, the cell height Hc of the first logic cell C1 may be given by adding 0.5 times the fin pitch P (i.e., 0.5P) to two times a height of a shorter block of the blocks PB and NB (e.g., the n-block NB). This may be differentiated from a logic cell with a symmetric block structure, whose cell height is given by multiplication of an integer with the fin pitch P. Although in the above example, the p-block height Hp was described to be longer than the n-block height Hn, but the inventive concept may not be limited thereto. For example, the n-block height Hn may be longer by 0.5P than the p-block height Hp. So far, some example embodiments of the inventive concept have been described with reference to the first logic cell C1, but other logic cells may be configured to have the same or similar structure as the first logic cell C1. For example, each of the logic cells may be configured in such a way that the p-block height Hp and the n-block height Hn have a difference of 0.5P. The asymmetric block structure of the logic cells may make it possible to suppress an unnecessary increase of a cell area, which may occur when the layout is modified to increase the cell area. This will be described in more detail with reference to FIGS. 3 and 4.

In the case where, as shown in FIG. 3, the first logic cell C1 has a symmetric block structure, the blocks PB and NB may have no difference in terms of their planar sizes or areas. For example, the blocks PB and NB of the first logic cell C1 may have the same width and the same height. As shown in FIG. 3, each of the blocks PB and NB may have a block height Hp or Hn of 5P, and thus, the first logic cell C1 may have a cell height Hc of 10P. In other words, the cell height Hc of the first logic cell C1 with the symmetric block structure may be given by multiplication of an integer with the fin pitch P. For a FinFET-based logic cell, by increasing the number of active patterns assigned to each logic cell, the cell area may be increased. In the case where the number of the active patterns AP provided in each of the active regions PR and NR of the logic cell is given by a predetermined design, the cell height of the logic cell may be increased by adding at least one dummy active pattern AP_DM between an adjacent pair of the active regions PR and NR or at both sides of each of the active regions PR and NR.

As shown in FIG. 4, in the case where one dummy active pattern AP_DM is added between the PMOSFET and NMOSFET regions PR and NR of FIG. 3 to increase the cell area, the cell height Hc may increase, and consequently, the area of the first logic cell C1 may also increase. For example, the cell height Hc of the first logic cell C1 of FIG. 4 may be 11 times the fin pitch P. In the case where the logic cell has a symmetric block structure, the cell height Hc increase may depend on the number of the active pattern AP added or by, for example, the increment of 1P. In this case, the cell height Hc increase may be beyond a desired incremental length for the cell height Hc, thereby causing an unnecessary increase in the cell area. According to an example embodiment of the inventive concept, the logic cell is provided to have an asymmetric block structure as previously described with reference to FIG. 2, and this may allow the cell height to be increased by a reduced incremental length of 0.5P. For example, the first logic cell C1 of FIG. 2 may have the cell height Hc of 10.5P, which is greater by 0.5P than the first logic cell C1 of FIG. 3. Such a reduction in an incremental length of the cell height Hc avoids an unnecessary increase in the cell area. Furthermore, according to an example embodiment of the inventive concept, there is no need to restrict a block of a logic cell to a symmetric structure.

Figure 5:
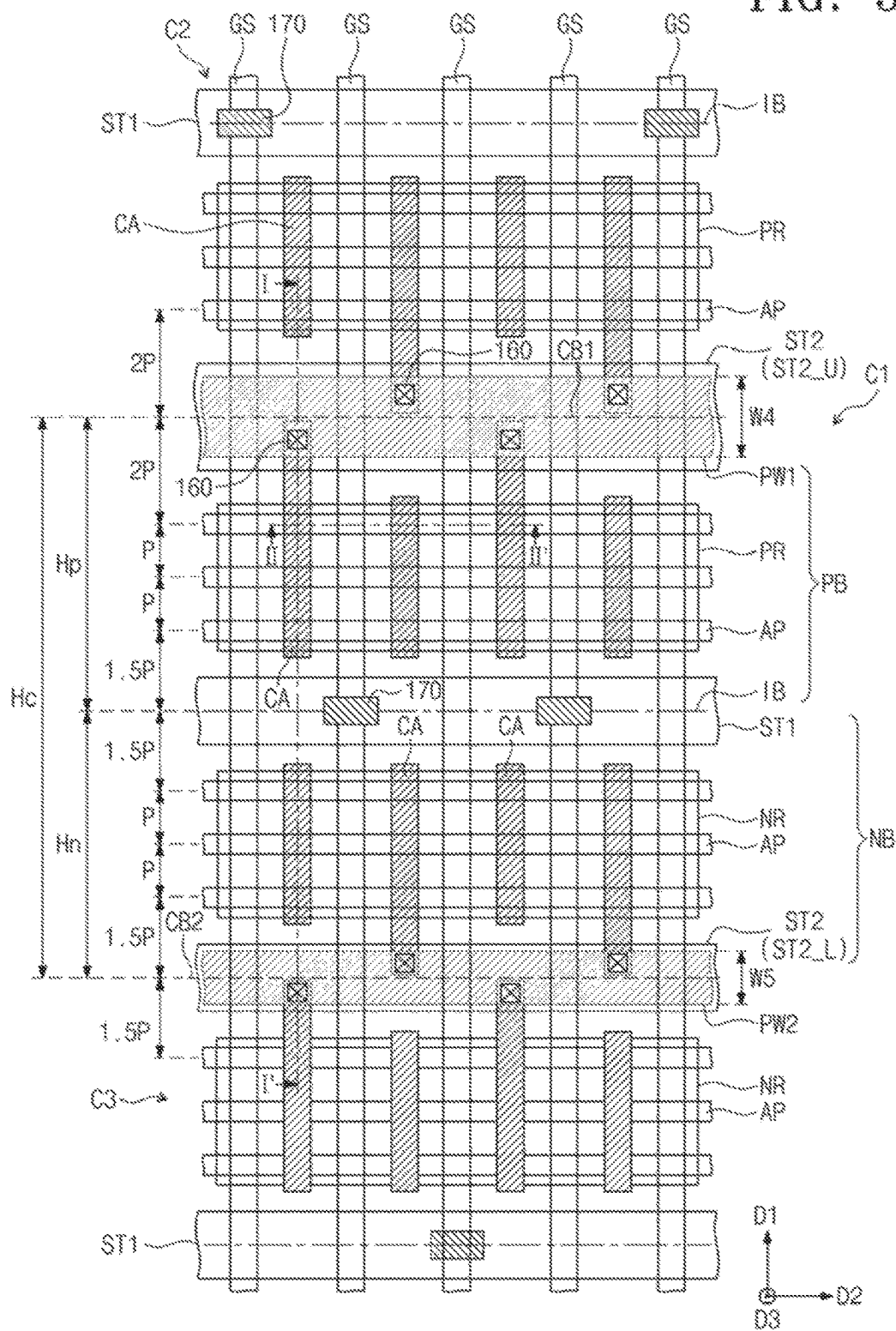
FIG. 5 is a plan view illustrating an example of a semiconductor device according to an example embodiment of the inventive concept.
Figure 6A:
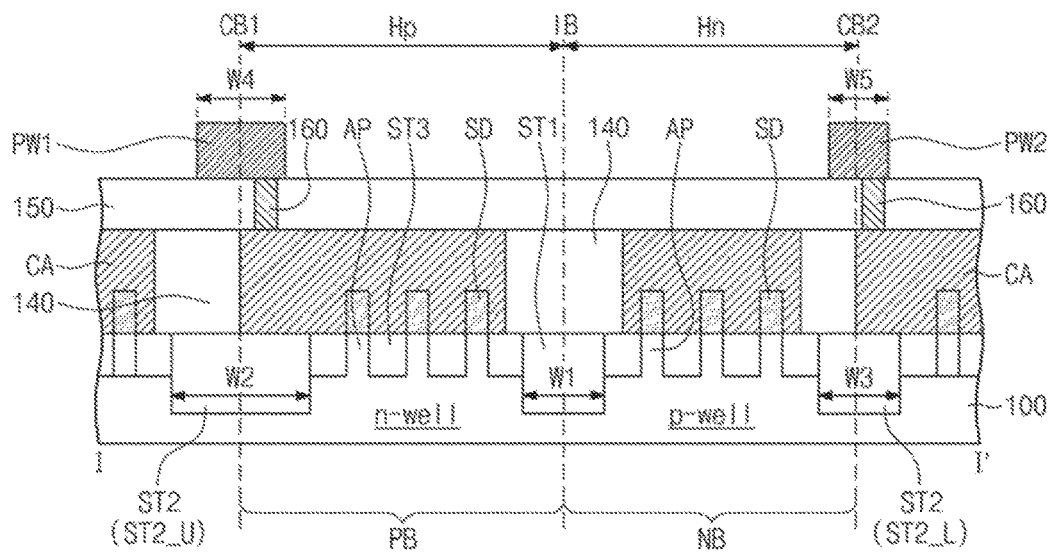
FIGS. 6A and 6B are cross-sectional views taken along lines I-I' and II-II', respectively, of FIG. 5 according to an example embodiment of the inventive concept.
Figure 6B:
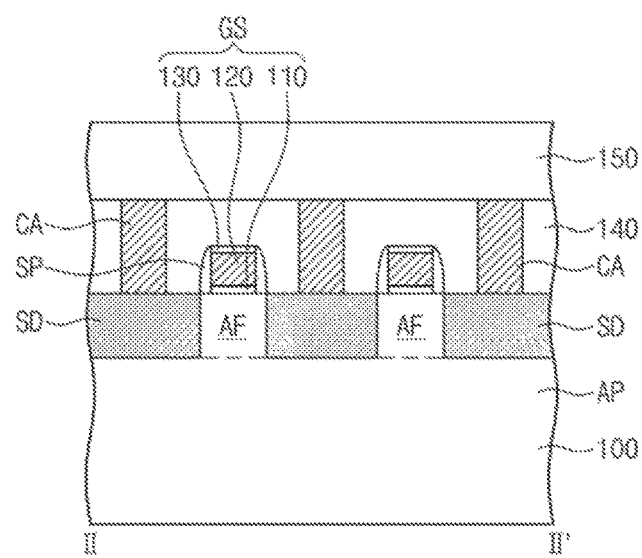

FIG. 5 is a plan view illustrating an example of a semiconductor device according to an example embodiment of the inventive concept. FIGS. 6A and 6B are cross-sectional views taken along lines I-I' and II-II', respectively, of FIG. 5.

Referring to FIGS. 1, 5, 6A, and 6B, a substrate 100 with the first logic cell C1 may be provided. In an example embodiment of the inventive concept, the substrate 100 may be a silicon substrate, a germanium substrate, or a silicon-on-insulator (SOI) substrate.

The first logic cell C1 may include the p-block PB and the n-block NB sectioned by the internal boundary IB. In an example embodiment of the inventive concept, the p-block PB and the n-block NB may be arranged in the first direction D1. The p-block PB and the n-block NB may correspond to n- and p-wells respectively that are provided in the substrate 100 of the first logic cell C1, and the internal boundary IB may correspond to an interface between the n- and p-wells. As described with reference to FIG. 2, the p-block height Hp may be greater than the n-block height Hn. Accordingly, the size or area of the p-block PB may be greater than that of the n-block NB. However, the inventive concept is not limited thereto; for example, the n-block height Hn may be greater than the p-block height Hp. Hereinafter, for the sake of simplicity, the description that follows will refer to an example in which the p-block height Hp is greater than the n-block height Hn.

The first logic cell C1 may include at least two active regions of different conductivity types (for example, the PMOSFET region PR and the NMOSFET region NR). The active patterns AP extending in the second direction D2 may be provided in each of the active regions PR and NR and may be arranged in the first direction D1. The active patterns AP may constitute each of the active regions PR and NR. In other words, the conductivity type of the active patterns AP of the PMOSFET region PR is different from that of the active patterns of the NMOSFET region NR. Each of the active patterns AP may have a structure protruding from the top surface of the substrate 100 in the third direction D3. In an example embodiment of the inventive concept, the active patterns AP may be parts of the substrate 100. Alternatively, the active patterns AP may include epitaxial patterns grown from the substrate 100. Here, the epitaxial patterns may include a plurality of epitaxial layers with different lattice constants. Accordingly, the active patterns AP may include at least one portion, to which a compressive or tensile strain is exerted.

In each of the active regions PR and NR, the active patterns AP may be arranged with the fin pitch P. For example, the fin pitch P of the active patterns AP of the PMOSFET region PR may be substantially the same as the fin pitch P of the active patterns AP of the NMOSFET region NR. The active patterns AP may be provided in each of the PMOSFET and NMOSFET regions PR and NR that are provided in each of the logic cell regions (e.g., the first to third logic cells C1-C3). For example, as shown, three active patterns AP may be provided in each of the active regions PR and NR, but the inventive concept may not be limited thereto.

A first device isolation layer ST1 may be provided in the substrate 100 and between the PMOSFET and NMOSFET regions PR and NR. For example, the first device isolation layer ST1 may be provided to separate the active regions PR and NR of the first logic cell C1. In an example embodiment of the inventive concept, a first width W1 measured in the first direction D1 of the first device isolation layer ST1 may be greater than the fin pitch P of the active patterns AP. The first width W1 of the first device isolation layer ST1 may be the minimum width, allowing the active regions PR and NR with different conductivity types to be separated from each other. The first device isolation layer ST1 may extend in the second direction D2.

Each of the active regions PR and NR of the first logic cell C1 may be spaced apart from the active region of other logic cell, which is positioned adjacent thereto in the first direction D1, by a second device isolation layer ST2. For example, the second device isolation layer ST2 may be interposed between the two adjacent PMOSFET regions PR with each in the first and second logic cells C1 and C2 respectively, and between the two adjacent NMOSFET regions NR with each in the first and third logic cells C1 and C3 respectively. The second device isolation layer ST2 may extend in the second direction D2. Hereinafter, for the sake of simplicity, a term "upper second device isolation layer ST2_U" will be used to refer to a portion of the second device isolation layer ST2 interposed between the PMOSFET regions PR of the first and second logic cells C1 and C2, and a term "lower second device isolation layer ST2_L" will be used to refer to another portion of the second device isolation layer ST2 between the NMOSFET regions NR of the first and third logic cells C1 and C3. For example, the upper second device isolation layer ST2_U may be provided in the substrate 100 and between an adjacent pair of the active patterns AP with one in the first logic cell C1 and the other one in the second logic cell C2, and the lower second device isolation layer ST2_L may be provided in the substrate 100 and between an adjacent pair of the active patterns AP with one in the first logic cell C1 and the other one in the third logic cell C3.

In an example embodiment of the inventive concept, when measured in the first direction D1, a second width W2 of the upper second device isolation layer ST2_U may be different from a third width W3 of the lower second device isolation layer ST2_L. For example, in the case where the p-block height Hp is greater than the n-block height Hn, the second width W2 of the upper second device isolation layer ST2_U may be greater than the third width W3 of the lower second device isolation layer ST2_L. Accordingly, the first separation distance between the active patterns AP defining the first cell boundary CB1 may be greater than the second separation distance between the active patterns AP defining the second cell boundary CB2. On the other hand, when the n-block height Hn is greater than the p-block height Hp, the second width W2 may be smaller than the third width W3, and the first separation distance may be smaller than the second separation distance. Although the third width W3 of the lower second device isolation layer ST2_L is illustrated to be substantially the same as the first width W1 of the first device isolation layer ST1, but the inventive concept is not limited thereto. The first and second device isolation layers ST1 and ST2 may be connected to each other, thereby constituting a single continuous body. The first and second device isolation layers ST1 and ST2 may be formed of or include, for example, a silicon oxide layer.

Third device isolation layers ST3 may be provided at both sides of each of the active patterns AP and may extend in the second direction D2. The third device isolation layers ST3 may be provided to expose upper portions of the active patterns AP. A term "active fin AF" may be used to refer to each of the upper portions of the active patterns AP that are exposed by the third device isolation layers ST3. The third device isolation layers ST3 may be provided to have a thickness smaller than those of the first and second device isolation layers ST1 and ST2. In an example embodiment of the inventive concept, the first, second, and third device isolation layers ST1, ST2, and ST3 may be provided to have top surfaces positioned at substantially the same height.

The first cell boundary CB1 may be defined between the first logic cell C1 and the second logic cell C2. The second cell boundary CB2 may be defined between the first logic cell C1 and the third logic cell C3. For example, the first cell boundary CB1 may be defined as a line equidistant from the active patterns AP that are respectively included in the first and second logic cells C1 and C2 and are most adjacent to each other in the first direction D1. Alternatively, the first cell boundary CB1 may be defined as a center line passing through a center, in the first direction D1, of the upper second device isolation layer ST2_U. Similarly, the second cell boundary CB2 may be defined as a line equidistant from the active patterns AP that are respectively included in the first and third logic cells C1 and C3 and are most adjacent to each other in the first direction D1. Alternatively, the second cell boundary CB2 may be defined as a center line passing through a center, in the first direction D1, of the lower second device isolation layer ST2_L. In an example embodiment of the inventive concept, the separation distance between the internal boundary IB and the first cell boundary CB1 (i.e., the p-block height Hp) may be greater by 0.5 times the fin pitch P (i.e., 0.5 P) than the separation distance between the internal boundary IB and the second cell boundary CB2 (i.e., the n-block height Hn). Accordingly, the first separation distance between the active patterns AP defining the first cell boundary CB1 may be greater by 1 time the fin pitch P (i.e., 1 P) than the second separation distance between the active patterns AP defining the second cell boundary CB2. As described previously, the first separation distance between the active patterns AP defining the first cell boundary CB1 is 4P, and the second separation distance between the active patterns AP defining the second cell boundary CB2 is 3P.

Gate structures GS may be provided on the active patterns AP to cross the active patterns AP and extend in the first direction D1. The gate structures GS may extend in the first direction D1 to cross the PMOSFET and NMOSFET regions PR and NR and may be arranged to space apart from each other in the second direction D2. In an example embodiment of the inventive concept, the gate structures GS may be further extended in the first direction D1 to cross the second and third logic cells C2 and C3. Each of the gate structures GS may include a gate insulating pattern 110, a gate electrode 120, and a gate capping pattern 130, which are sequentially stacked on the substrate 100. The gate insulating pattern 110 may be formed of or include at least one of a silicon oxide layer, a silicon oxynitride layer, and a high-k dielectric layer which has a dielectric constant higher than that of the silicon oxide layer. The gate electrode 120 may be formed of or include at least one of doped semiconductors, metals, and conductive metal nitrides. The gate capping pattern 130 may be formed of or include at least one of a silicon oxide layer, a silicon nitride layer, and a silicon oxynitride layer. Gate spacers SP may be provided on sidewalls of the gate structures GS. The gate spacers SP may be formed of or include at least one of a silicon oxide layer, a silicon nitride layer, and a silicon oxynitride layer.

Source/drain regions SD may be provided at both sides of each of the gate structures GS and in or on the active patterns AP. The source/drain regions SD may be locally formed in portion of the active pattern AP positioned at both sides of each gate structure GS, but in certain example embodiments of the inventive concept, the source/drain regions SD may be formed to have portions positioned on the third device isolation layers ST3. The source/drain regions SD in the PMOSFET region PR may be p-type impurity regions and the source/drain regions SD in the NMOSFET region NR may be n-type impurity regions. The active patterns AP may include the upper portions (e.g., the active fin AF), which are positioned below and overlapped with the gate structures GS, respectively, and at least a portion of each active fin AF may serve as a channel region of a transistor.

Source/drain contacts CA may be provided at both sides of each of the gate structures GS. The source/drain contacts CA may be electrically connected to at least one of the source/drain regions SD. In an example embodiment of the inventive concept, at least one of the source/drain contacts CA may be connected to a plurality of the source/drain regions SD adjacent to each other in the first direction D1. As an example, in the PMOSFET region PR, at least one of the source/drain contacts CA may be connected to a plurality of the source/drain regions SD adjacent to each other in the first direction D1. Similarly, in the NMOSFET region NR, at least one of the source/drain contacts CA, other than the ones in the PMOSFET region PR, may be connected to a plurality of the source/drain regions SD adjacent to each other in the first direction D1. The source/drain contacts CA may be configured to have various shapes. As an example, when viewed in a plan view, some of the source/drain contacts CA may be shaped like a bar extending in the first direction D1. The source/drain contacts CA may be formed of or include at least one of, for example, doped semiconductors, metals, metal silicides, and conductive metal nitrides.

The source/drain contacts CA may be provided in a first interlayered insulating layer 140. The first interlayered insulating layer 140 may be formed of or include at least one of, for example, a silicon oxide layer, a silicon nitride layer, and a silicon oxynitride layer. Top surfaces of the source/drain contacts CA may be coplanar with that of the first interlayered insulating layer 140. The first interlayered insulating layer 140 may be provided to cover the gate structures GS and the source/drain regions SD.

A second interlayered insulating layer 150 may be provided on the first interlayered insulating layer 140. The second interlayered insulating layer 150 may be formed of or include at least one of, for example, a silicon oxide layer, a silicon nitride layer, and a silicon oxynitride layer. Via contacts 160 may be provided in the second interlayered insulating layer 150. Each of the source/drain contacts CA may be connected to a corresponding one of conductive lines, which are provided on the second interlayered insulating layer 150, through at least one of the via contacts 160. The conductive lines may include common conductive lines, first conductive lines, and second conductive lines. The via contacts 160 may be formed of or include a conductive material. In certain example embodiments of the inventive concept, the source/drain contacts CA may be directly connected to the conductive lines, without the use of the via contacts 160.

At least one of the common conductive lines may be provided along a boundary of the first logic cell C1 extending in the second direction D2. For example, the common conductive lines may include a first common conductive line PW1, which extends along the first cell boundary CB1 and in the second direction D2, and a second common conductive line PW2, which extends along the second cell boundary CB2 and in the second direction D2. The first common conductive line PW1 may be disposed between the PMOSFET regions PR, which are adjacent to each other in the first direction D1, of the first and second logic cells C1 and C2 respectively and may be overlapped with an upper second device isolation layer ST2_U. The second common conductive line PW2 may be disposed between the NMOSFET regions NR, which are adjacent to each other in the first direction D1, of the first and third logic cells C1 and C3 respectively and may be overlapped with the lower second device isolation layer ST2_L. In an example embodiment of the inventive concept, a fourth width W4 of the first common conductive line PW1 may be greater than a fifth width W5 of the second common conductive line PW2. Since the p-block PB is designed to have an area larger than that of the n-block NB, process margin for forming the p-block PB is maintained, even when the first common conductive line PW1 is formed to have a relatively large width. Furthermore, in the case where one of the common conductive lines is formed to have a larger width, resistance is reduced and electrical characteristics of a semiconductor device is enhanced.

In an example embodiment of the inventive concept, some of the source/drain contacts CA provided in the PMOSFET region PR of the first logic cell C1 may be connected to the first common conductive line PW1 through corresponding ones of the via contacts 160. End portions of the source/drain contacts CA connected to the first common conductive line PW1 may extend toward the upper second device isolation layer ST2_U and may be overlapped with the first common conductive line PW1. The first common conductive line PW1 may provide a drain voltage (Vdd) (e.g., a power voltage) to the source/drain regions SD that are connected thereto through the via contacts 160 and the source/drain contacts CA. Similarly, some of the source/drain contacts CA provided in the NMOSFET region NR of the first logic cell C1 may be connected to the second common conductive line PW2 through corresponding ones of the via contacts 160. End portions of the source/drain contacts CA connected to the second common conductive line PW2 may extend toward the lower second device isolation layer ST2_L and may be overlapped with the second common conductive line PW2. The second common conductive line PW2 may provide a source voltage (Vss) (e.g., a ground voltage) to the source/drain regions SD that are connected thereto through the via contacts 160 and the source/drain contacts CA.

The first common conductive line PW1 may be shared by the first and second logic cells C1 and C2 adjacent to each other in the first direction D1, and the second common conductive line PW2 may be shared by the first and third logic cells C1 and C3 adjacent to each other in the first direction D1. For example, some of the source/drain contacts CA of the second logic cell C2 may be connected to the first common conductive line PW1 through the via contacts 160. Similarly, some of the source/drain contacts CA of the third logic cell C3 may be connected to the second common conductive line PW2 through the via contacts 160. Others of the source/drain contacts CA disconnected from the first and second common conductive lines PW1 and PW2 may be connected to first conductive lines provided on the second interlayered insulating layer 150. The first conductive lines may be provided to connect a plurality of the source/drain contacts CA to each other. The first conductive lines may be used to apply substantially the same voltage to the source/drain regions SD through the plurality of the source/drain contacts CA connected thereto. The positions and the numbers of the first and second conductive lines may be variously changed corresponding to different designs for realizing different desired functions (e.g., a Boolean logic function or a storage function) of each logic cell. The first and second common conductive lines PW1 and PW2 and the first and second conductive lines may be formed of or include at least one of, for example, doped semiconductors, conductive metal nitrides, and metals.

Gate contacts 170 may be provided on the gate structures GS and may be electrically connected to the gate structures GS. The gate contacts 170 may include substantially the same material as that of the source/drain contacts CA. For example, the gate contacts 170 may be formed of or include at least one of, for example, doped semiconductors, metals, metal silicides, and conductive metal nitrides. In addition, second conductive lines may be provided on the second interlayered insulating layer 150 and may be connected to the gate contacts 170. The second conductive lines may be configured to apply a gate voltage to the gate structures GS through the gate contacts 170.

Figure 7A:
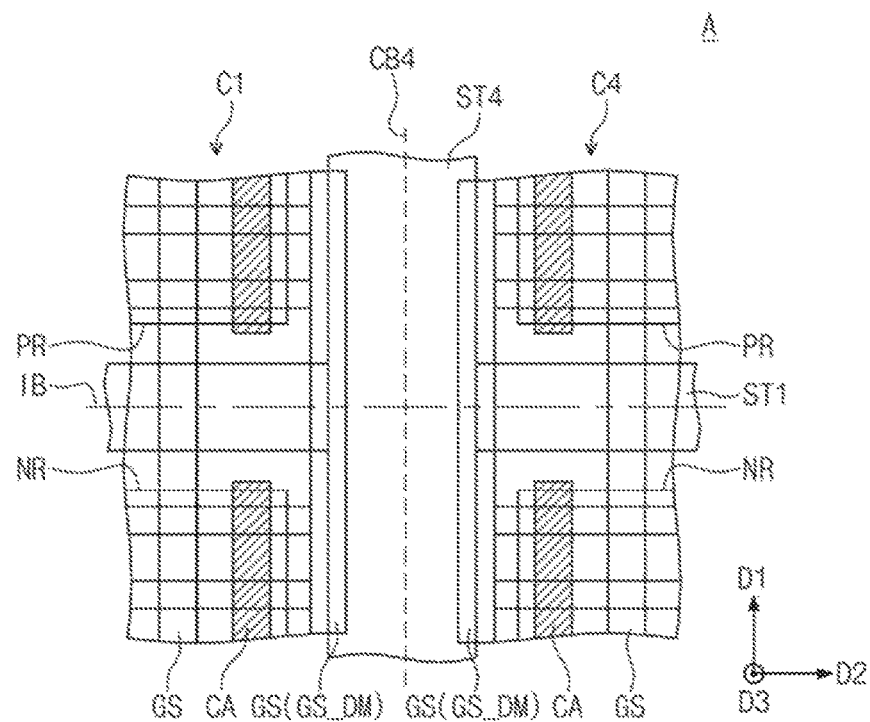
FIG. 7A is a plan view illustrating an example of a boundary region A between first and fourth logic cells of FIG. 1 according to an example embodiment of the inventive concept.

FIG. 7A is a plan view illustrating an example of the boundary region A between the first and fourth logic cells C1 and C4 of FIG. 1.

Referring to FIG. 7A, a fourth device isolation layer ST4 may be provided along the fourth cell boundary CB4 between the first and fourth logic cells C1 and C4 arranged in the second direction D2 and may extend in the first direction D1. The fourth device isolation layer ST4 may separate the active regions PR and NR of the first logic cell C1 from the active regions PR and NR of the fourth logic cell C4. The fourth device isolation layer ST4 may be connected to the first and second device isolation layers ST1 and ST2. The gate structure GS that is most adjacent to the fourth cell boundary CB4 among the gate structures GS of the first logic cell C1 may serve as a dummy gate structure GS_DM, which is partially overlapped with the fourth device isolation layer ST4. Similar to this, the gate structure GS that is most adjacent to the fourth cell boundary CB4 among the gate structures GS of the fourth logic cell C4 may serve as the dummy gate structure GS_DM, which is partially overlapped with the fourth device isolation layer ST4. For example, a pair of dummy gate structures GS_DM, which include one from the first logic cell and the other one from the fourth logic cell, may be disposed adjacent to each other with the fourth cell boundary CB4 interposed therebetween.

Figure 7B:
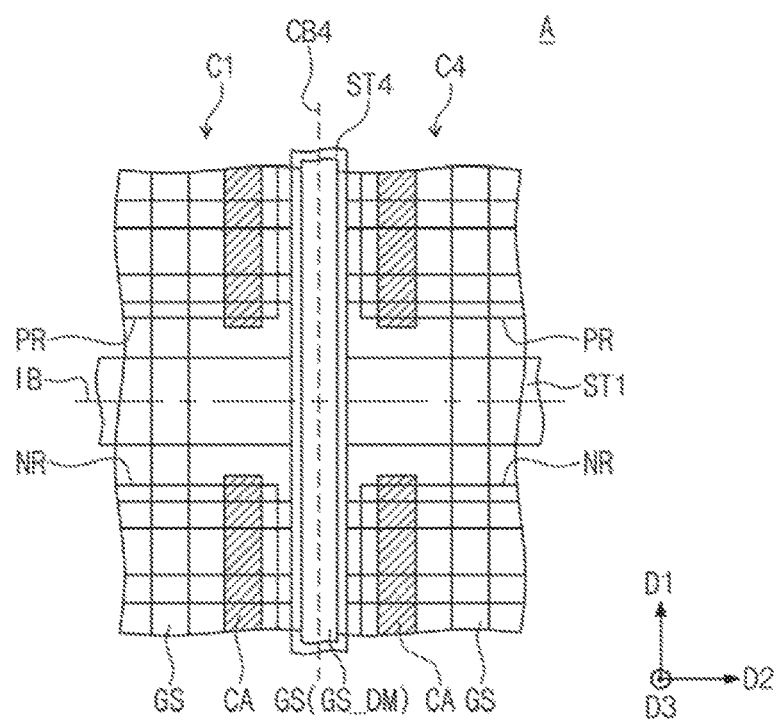
FIG. 7B is a plan view illustrating another example of a boundary region A between first and fourth logic cells of FIG. 1 according to an example embodiment of the inventive concept.
Figure 8A:
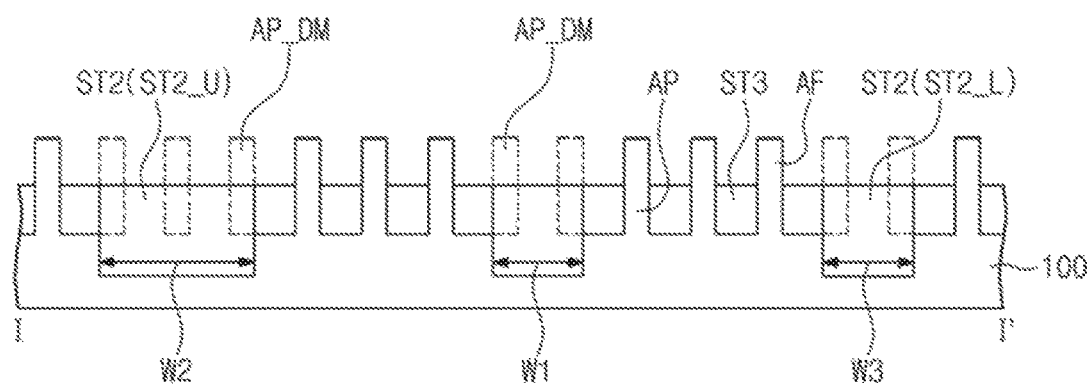
Figure 8B:
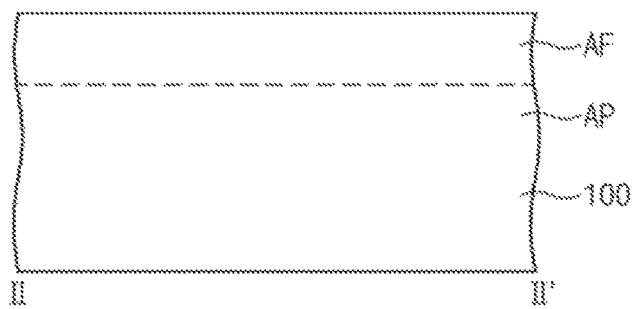
Figure 9A:
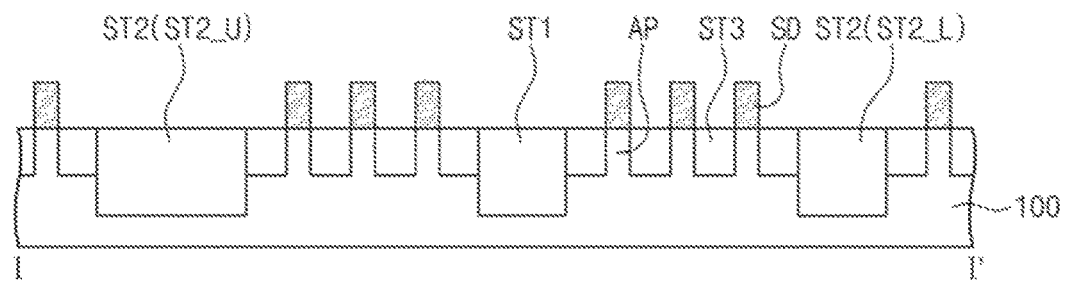
Figure 9B:
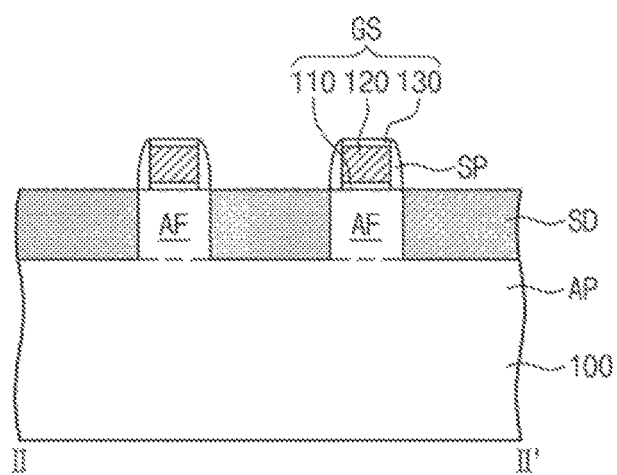
Figure 10A:
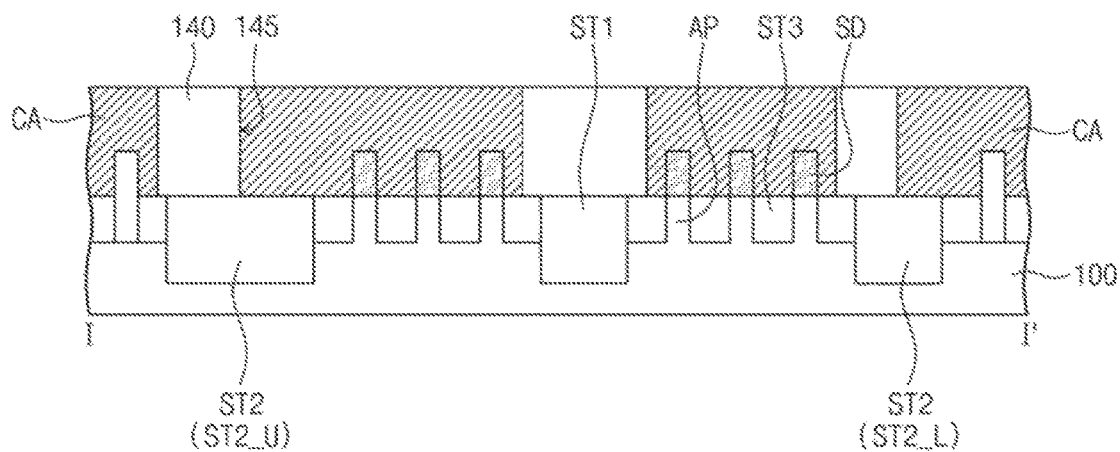
Figure 10B:
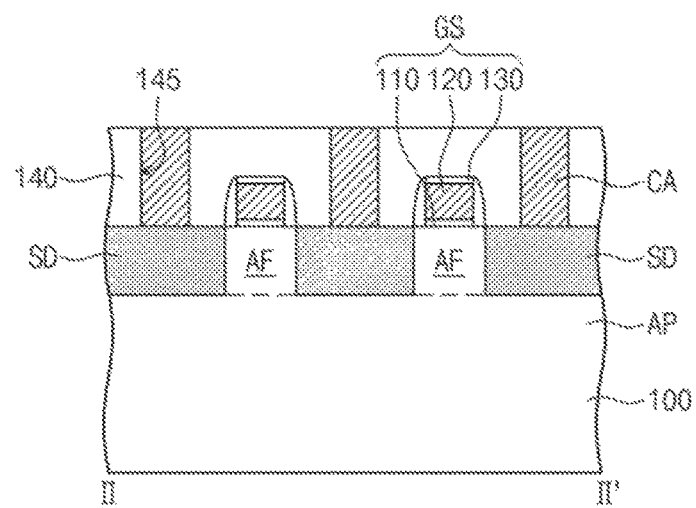

FIG. 7B is a plan view illustrating another example of the boundary region A between the first and fourth logic cells C1 and C4 of FIG. 1.

Referring to FIG. 7B, the dummy gate structure GS_DM may be solely provided between the first and fourth logic cells C1 and C4 arranged in the second direction D2. The dummy gate structure GS_DM may cover the fourth device isolation layer ST4 and extend in the extension direction of the fourth device isolation layer ST4.

Hereinafter, a method of fabricating a semiconductor device according to an example embodiment of the inventive concept will be described.

FIGS. 8A through 10A are cross-sectional views, which are taken along line I-I' of FIG. 5 to illustrate a method of fabricating a semiconductor device, according to an example embodiment of the inventive concept. FIGS. 8B through 10B are cross-sectional views taken along line II-II' of FIG. 5.

Referring to FIGS. 1, 5, 8A, and 8B, the active patterns AP may be formed on the substrate 100. In an example embodiment of the inventive concept, the substrate 100 may be a silicon substrate, a germanium substrate, or a silicon-on-insulator (SOI) substrate. The active patterns AP may be formed between the third device isolation layers ST3 to have an upwardly protruding fin-shaped structure, and here, the third device isolation layers ST3 may be formed to extend in the second direction D2. For example, each of the active patterns AP may include an upper portion (e.g., the active fin AF) that is exposed by the third device isolation layers ST3. The active patterns AP may be arranged in the first direction D1. In an example embodiment of the inventive concept, the active patterns AP may be formed by patterning the substrate 100. In certain example embodiments of the inventive concept, the active patterns AP may be formed by forming an epitaxial layer on the substrate 100 and patterning the epitaxial layer. The epitaxial layer may include a plurality of epitaxial layers with different lattice constants. In this case, the active pattern AP may include at least one portion, to which a compressive or tensile strain is exerted.

The first device isolation layer ST1 and the second device isolation layer ST2 may be formed in the substrate 100. The first device isolation layer ST1 may be formed to extend in the second direction D2 and separate the PMOSFET region PR of the first logic cell C1 from the NMOSFET region NR. The first device isolation layer ST1 may be formed to have the first width W1. The first width W1 may be greater than the fin pitch P of the active patterns AP. The second device isolation layer ST2 may be formed to extend in the second direction D2 and separate adjacent ones of the active regions, which are respectively included in the first logic cell C1 and other logic cells (e.g., C2 and C3) adjacent thereto, from each other. As an example, the second device isolation layer ST2 may include the upper second device isolation layer ST2_U between the PMOSFET region PR of the first logic cell C1 and the PMOSFET region PR of the second logic cell C2 and the lower second device isolation layer ST2_L between the NMOSFET region NR of the first logic cell C1 and the NMOSFET region NR of the third logic cell C3. The second width W2 of the upper second device isolation layer ST2_U may be greater than the third width W3 of the lower second device isolation layer ST2_L. The first and second device isolation layers ST1 and ST2 may be formed by a shallow trench isolation (STI) process. The dummy active patterns AP_DM between adjacent active regions of the logic cell or cells may be removed during the formation of the first and second device isolation layers ST1 and ST2. As an example, the first and second device isolation layers ST1 and ST2 may include a silicon oxide layer. The first and second device isolation layers ST1 and ST2 may be formed to be thicker than the third device isolation layers ST3.

Referring to FIGS. 1, 5, 9A, and 9B, the gate structures GS may be formed to cross the active patterns AP and extend in the first direction D1. Each of the gate structures GS may include the gate insulating pattern 110, the gate electrode 120, and the gate capping pattern 130, which are sequentially stacked on the substrate 100. In an example embodiment of the inventive concept, the formation of the gate structures GS may include sequentially forming a gate insulating layer, a gate electrode layer, and a gate capping layer on the substrate 100 to cover the active patterns AP and performing a patterning process thereon. The gate insulating layer may include at least one of a silicon oxide layer, a silicon oxynitride layer, and a high-k dielectric layer of which a dielectric constant is higher than that of a silicon oxide layer. The gate electrode layer may include at least one of doped a semiconductor layer, a metal layer, and a conductive metal nitride layer. The gate capping layer may include at least one of a silicon oxide layer, a silicon nitride layer, and a silicon oxynitride layer. At least one of the gate insulating layer, the gate electrode layer, and the gate capping layer may be formed by a chemical vapor deposition process or a sputtering process. The gate spacers SP may be formed on sidewalls of the gate structures GS. The formation of the gate spacers SP may include forming a gate spacer layer to cover the gate structures GS and anisotropically etching the gate spacer layer. The gate spacer layer may include at least one of a silicon oxide layer, a silicon nitride layer, and a silicon oxynitride layer.

Unlike that described above, the gate structures GS may be formed by a gate last process using a sacrificial gate pattern. For example, the formation of the gate structures GS may include forming a sacrificial gate pattern to cross the active patterns AP, forming the gate spacers SP on both sidewalls of the sacrificial gate pattern, removing the sacrificial gate pattern to define a gate region exposing the active patterns AP between the gate spacers SP, and sequentially forming the gate insulating pattern 110, the gate electrode 120, and the gate capping pattern 130 in the gate region.

The source/drain regions SD may be formed at both sides of the gate structures GS. For example, the source/drain regions SD may be formed in the active patterns AP that are not covered with the gate structures GS. The source/drain regions SD may be doped with impurities. For example, the source/drain regions SD in the PMOSFET region PR may be doped with p-type impurities, and the source/drain regions SD in the NMOSFET region NR may be doped with n-type impurities.

Referring to FIGS. 1, 5, 10A, and 10B, the first interlayered insulating layer 140 may be formed to cover the gate structures GS, and then, the source/drain contacts CA may be connected to the source/drain regions SD through the first interlayered insulating layer 140. The first interlayered insulating layer 140 may be formed of or include at least one of, for example, a silicon oxide layer, a silicon nitride layer, and a silicon oxynitride layer. As an example, the formation of the source/drain contacts CA may include etching the first interlayered insulating layer 140 to form source/drain contact holes 145 and filling the source/drain contact holes 145 with a conductive layer. The source/drain contact holes 145 may be formed to have a groove shape extending in the first direction D1. The conductive layer may be formed of or include at least one of, for example, doped semiconductors, metals, metal silicides, and conductive metal nitrides. The conductive layer may be formed by a chemical vapor deposition or sputtering process.

The gate contacts 170 may be formed on the gate structures GS and may be electrically connected to the gate structures GS. The gate contacts 170 may be formed of substantially the same material as that of the source/drain contacts CA. For example, the gate contacts 170 may be formed of or include at least one of, for example, doped semiconductors, metals, metal silicides, and conductive metal nitrides.

Referring back to FIGS. 1, 5, 6A, and 6B, the second interlayered insulating layer 150 may be formed on the structure provided with the source/drain contacts CA and the gate contacts 170. The second interlayered insulating layer 150 may be formed of or include at least one of, for example, a silicon oxide layer, a silicon nitride layer, and a silicon oxynitride layer. Via contacts 160 may be formed in or through the second interlayered insulating layer 150. The via contacts 160 may be electrically connected to the source/drain contacts CA.

The first and second common conductive lines PW1 and PW2 may be formed on the second interlayered insulating layer 150. The first and second common conductive lines PW1 and PW2 may extend in the second direction D2 and may be spaced apart from each other in the first direction D1. The first common conductive line PW1 may be formed between the PMOSFET regions PR, which are adjacent to each other in the first direction D1, of the first and second logic cells C1 and C2 respectively and may be overlapped with the upper second device isolation layer ST2_U. The second common conductive line PW2 may be formed between the NMOSFET regions NR, which are adjacent to each other in the first direction D1, of the first and third logic cells C1 and C3 respectively and may be overlapped with the lower second device isolation layer ST2_L. In some embodiments, the fourth width W4 of the first common conductive line PW1 may be greater than the fifth width W5 of the second common conductive line PW2. Since the p-block PB is designed to have an area larger than that of the n-block NB, process margin for forming the p-block PB is maintained and moreover, to allow the first common conductive line PW1 to have a width larger than that of the second common conductive line PW2.

In an example embodiment of the inventive concept, the first common conductive line PW1 may be connected to some of the source/drain contacts CA, which are provided in the PMOSFET region PR of the first logic cell C1, through corresponding ones of the via contacts 160. The second common conductive line PW2 may be connected to some of the source/drain contacts CA, which are provided in the NMOSFET region NR of the first logic cell C1, through corresponding ones of the via contacts 160. The first common conductive line PW1 may be shared by the first and second logic cells C1 and C2 adjacent to each other in the first direction D1, and the second common conductive line PW2 may be shared by the first and third logic cells C1 and C3 adjacent to each other in the first direction D1.

The first and second conductive lines may be formed on the second interlayered insulating layer 150. The first conductive lines may be connected to the source/drain contacts CA which are disconnected from the first and second common conductive lines PW1 and PW2, and the second conductive lines may be connected to the gate contacts 170. The first and second common conductive lines PW1 and PW2 and the first and second conductive lines may be formed of or include at least one of, for example, doped semiconductors, conductive metal nitrides, and metals.

Figure 11:
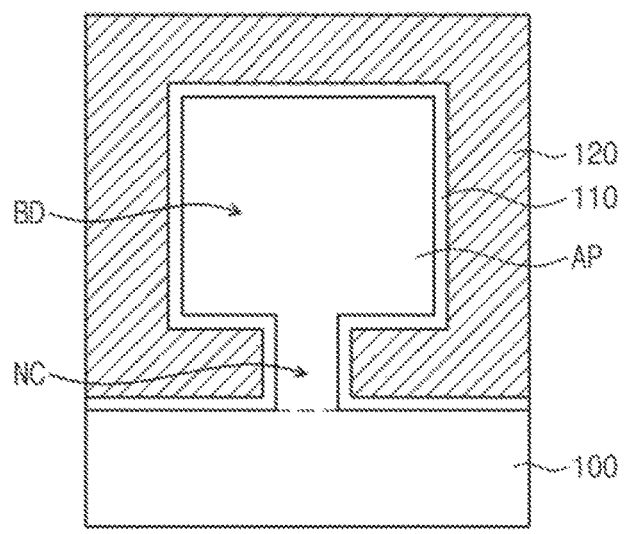
FIG. 11 is a cross-sectional view illustrating an example of an active pattern of a semiconductor device according to an example embodiment of the inventive concept.

So far, the active patterns AP have been illustrated to have a fin-shaped structure, but a structure thereof may be variously changed. FIG. 11 is a cross-sectional view illustrating an example of an active pattern of a semiconductor device according to an example embodiment of the inventive concept. The active pattern AP may be provided to have an omega-shaped cross-section; for example, the active pattern AP may include a neck portion NC adjacent to the substrate 100 and a body portion BD, whose width is larger than that of the neck portion NC. The gate insulating pattern 110 and the gate electrode 120 may be sequentially provided on the active pattern AP. The gate electrode 120 may include at least one portion positioned below the active pattern AP.

Figure 12:
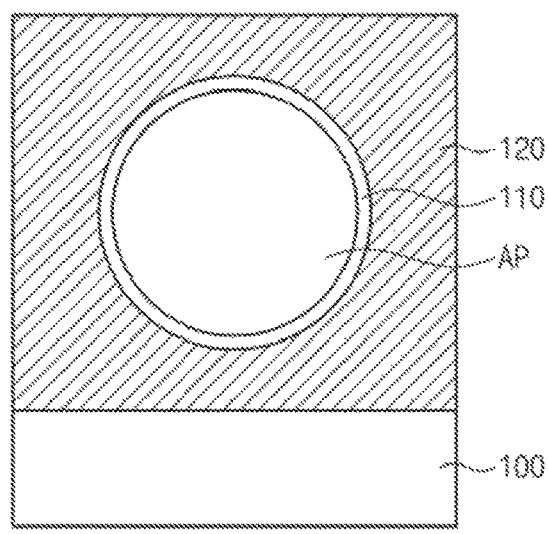
FIG. 12 is a cross-sectional view illustrating another example of an active pattern of a semiconductor device according to an example embodiment of the inventive concept.

FIG. 12 is a cross-sectional view illustrating another example of an active pattern of a semiconductor device according to an example embodiment of the inventive concept. The active pattern AP of the semiconductor device may be provided in the form of a nanowire vertically separated from the substrate 100. The gate insulating pattern 110 and the gate electrode 120 may be sequentially provided on the active pattern AP. The gate electrode 120 may include a portion interposed between the active pattern AP and the substrate 100.

According to an example embodiment of the inventive concept, when there is a need to increase an area of a logic cell, by reducing the increment in the unit size of a cell height, it is possible to reduce or minimize an unnecessary increase in a cell area. As a result, a highly-integrated semiconductor device can be easily realized.

While some embodiments of the inventive concept have been particularly shown and described, it will be understood by one of ordinary skill in the art that variations in form and detail may be made therein without departing from the spirit and scope of the appended claims.

What is claimed is:

1. A semiconductor device, comprising:
a substrate including first, second, and third logic cells, the second and third logic cells being spaced apart from each other in a first direction with the first logic cell interposed therebetween; and
active patterns provided in each of the first to third logic cells to protrude from the substrate,
wherein the active patterns are arranged in the first direction and extend in a second direction crossing the first direction,
wherein each of the first, second, and third logic cells includes PMOSFET region and NMOSFET region that are spaced apart from each other in the first direction, and
wherein a first distance between a first adjacent pair of the active patterns, which include one from the PMOSFET region of the first logic cell and other one from the PMOSFET region of the second logic cell, that are most adjacent to each other in the first direction is different from a second distance between a second adjacent pair of the active patterns, which include one from the NMOSFET region of the first logic cell and other one from the NMOSFET region of the third logic cell, that are most adjacent to each other in the first direction.

2. The semiconductor device of claim 1, wherein the active patterns in the PMOSFET region are provided to have a first pitch,
wherein the active patterns in the NMOSFET region are provided to have a second pitch that is substantially the same as the first pitch, and
wherein a difference between the first and second distances is substantially the same as the first pitch.

3. The semiconductor device of claim 2, further comprising a first device isolation layer provided in each of the first to third logic cells,
wherein the first device isolation layer is provided between the PMOSFET region and the NMOSFET region to extend in the second direction.

4. The semiconductor device of claim 3, wherein a first width of the first device isolation layer measured in the first direction is larger than the first pitch.

5. The semiconductor device of claim 1, wherein a first cell boundary is defined between the PMOSFET regions of the first and second logic cells,
wherein a second cell boundary is defined between the NMOSFET regions of the first and third logic cells,
wherein an internal boundary is defined between the PMOSFET region and the NMOSFET region of the first logic cell, and
wherein a first height from the internal boundary to the first cell boundary is different from a second height from the second cell boundary to the internal boundary, when viewed in a plan view.

6. The semiconductor device of claim 5, wherein the first cell boundary is equidistant from the first adjacent pair of the active patterns defining the first distance,
wherein the second cell boundary is equidistant from the second adjacent pair of the active patterns defining the second distance, and
wherein the internal boundary is equidistant from a third adjacent pair of the active patterns, which include one from the PMOSFET region of the first logic cell and other one from the NMOSFET region of the second logic cell, that are most adjacent to each other in the first direction.

7. The semiconductor device of claim 5, wherein the active patterns in the PMOSFET region are provided to have a first pitch,
wherein the active patterns in the NMOSFET region are provided to have a second pitch that is substantially the same as the first pitch,
wherein a difference between the first and second distances is substantially the same as the first pitch, and
wherein a difference between the first and second heights is half the first pitch.

8. The semiconductor device of claim 5, further comprising:
a first device isolation layer provided in the substrate and between the first adjacent pair of the active patterns defining the first distance; and
a second device isolation layer provided in the substrate and between the second adjacent pair of the active patterns defining the second distance,
wherein the first and second device isolation layers extend in the second direction, and
wherein a first width of the first device isolation layer is different from a second width of the second device isolation layer, when measured in the first direction.

9. The semiconductor device of claim 8, wherein the first cell boundary is defined as a center line of the first device isolation layer, and
wherein the second cell boundary is defined as a center line of the second device isolation layer.

10. The semiconductor device of claim 5, wherein the first height is greater than the second height, and
wherein the first distance is greater than the second distance.

11. The semiconductor device of claim 5, wherein the second height is greater than the first height, and
wherein the first distance is smaller than the second distance.

12. The semiconductor device of claim 1, wherein the PMOSFET region of the first logic cell is adjacent to the PMOSFET region of the second logic cell in the first direction, and
wherein the NMOSFET region of the third logic cell is adjacent to the NMOSFET region of the first logic cell in the first direction.

13. The semiconductor device of claim 1, further comprising:
gate structures crossing the active patterns;
source/drain regions provided on the active patterns and at both sides of the gate structures;
a first common conductive line between the PMOSFET regions of the first and second logic cells to extend in the second direction, the first common conductive line electrically connected to at least one of the source/drain regions in the PMOSFET regions of the first and second logic cells; and
a second common conductive line between the NMOSFET regions of the first and third logic cells to extend in the second direction, the first common conductive line electrically connected to at least one of the source/drain regions in the NMOSFET regions of the first and third logic cells.

14. The semiconductor device of claim 13, wherein the first common conductive line has a first width and the second common conductive line has a second width, when measured in the first direction, and
wherein the first width is different from the second width.

15. The semiconductor device of claim 14, wherein the first distance is greater than the second distance, and
wherein the first width is greater than the second width.

16. The semiconductor device of claim 14, wherein the second distance is greater than the first distance, and
wherein the first width is smaller than the second width.

17. A semiconductor device, comprising:
a substrate including a first NMOSFET region, a second NMOSFET region, a first PMOSFET region, and a second PMOSFET region; and
active patterns provided in each of the first NMOSFET, the second NMOSFET, the first PMOSFET and the second PMOSFET regions to protrude from the substrate,
wherein the first NMOSFET, the second NMOSFET, the first PMOSFET and the second PMOSFET regions are sequentially arranged in a first direction,
wherein the active patterns are arranged in the first direction and extend in a second direction crossing the first direction, and
wherein a first distance between a first adjacent pair of the active patterns, which include one from the first PMOSFET region and other one from the second PMOSFET region, that are most adjacent to each other in the first direction is different from a second distance between a second adjacent pair of the active patterns, which include one from the first NMOSFET region and other one from the second NMOSFET region, that are most adjacent to each other in the first direction.

18. The semiconductor device of claim 17, wherein the active patterns in each of the first NMOSFET, the second NMOSFET, the first PMOSFET and the second PMOSFET regions are provided to have a first pitch, and
wherein a difference between the first and second distances is substantially the same as the first pitch.

19. A semiconductor device, comprising:
a substrate including a plurality of logic cells arranged in a first direction, each of the plurality of logic cells comprising PMOSFET and NMOSFET regions that are spaced apart from each other in the first direction; and
active patterns provided in each of the PMOSFET and NMOSFET regions and arranged in the first direction, the active patterns protruding from the substrate and extending in a second direction crossing the first direction,
wherein the plurality of logic cells comprises first, second, and third logic cells arranged in the first direction, the first logic cell interposed between the second and third logic cells,
wherein the first logic cell includes first and second cell boundaries, the first cell boundary between the PMOSFET regions of the first and second logic cells and the second cell boundary between the NMOSFET regions of the first and third logic cells,
wherein the first logic, cell further includes an internal boundary between the PMOSFET and NMOSFET regions of the first logic cell,
wherein the internal boundary is equidistant from a first adjacent pair of the active patterns, which include one from the PMOSFET region and other one from the NMOSFET region, that are most adjacent to each other in the first direction,
wherein a first height from the internal boundary to the first cell boundary is greater than a second height from the second cell boundary to the internal boundary,
wherein the first cell boundary is equidistant from a second adjacent pair of the active patterns, which include one from the PMOSFET region of the first logic cell and other one from the PMOSFET region of the second logic cell, that are most adjacent to each other in the first direction, and
wherein the second cell boundary is equidistant from a third adjacent pair of the active patterns, which include one from the NMOSFET region of the first logic cell and other one from the NMOSFET region of the third logic cell, that are most adjacent to each other in the first direction.

* * * * *